United States Patent
Baldus et al.

(10) Patent No.: US 6,177,136 B1
(45) Date of Patent: Jan. 23, 2001

(54) PROCESS FOR COATING SUBSTRATES WITH A SILICIUM-CONTAINING LAYER

(75) Inventors: Hans-Peter Baldus, Leverkusen; Gerd Passing, Köln; Lothar Schönfelder, Coburg; Rolf Meistring, Glonn; Hannelore Benien, München; Marc Haltrich, Bad Aibling, all of (DE)

(73) Assignee: Bayer AG, Leverkusen (DE)

( * ) Notice: Under 35 U.S.C. 154(b), the term of this patent shall be extended for 0 days.

(21) Appl. No.: 09/242,975
(22) PCT Filed: Aug. 29, 1997
(86) PCT No.: PCT/EP97/04715
§ 371 Date: May 28, 1999
§ 102(e) Date: Feb. 26, 1999
(87) PCT Pub. No.: WO98/10118
PCT Pub. Date: Mar. 12, 1998

(30) Foreign Application Priority Data

Sep. 4, 1996 (DE) .............................................. 196 35 848

(51) Int. Cl.$^7$ .................................................. C23C 16/30
(52) U.S. Cl. .................................. 427/255.393; 427/578; 427/376.2; 428/688; 428/698
(58) Field of Search ...................... 427/255.23, 255.38, 427/255.393, 255.394, 578, 376.2; 428/688, 698

(56) References Cited

U.S. PATENT DOCUMENTS

| 4,990,365 | | 2/1991 | Treichel et al. |
|---|---|---|---|
| 5,233,066 | * | 8/1993 | Jansen et al. ............ 556/402 |
| 5,312,942 | * | 5/1994 | Jansen et al. ............ 556/402 |
| 5,324,690 | * | 6/1994 | Gelatos et al. ........... 438/634 |
| 5,405,982 | * | 4/1995 | Loffelholz et al. ................. 556/173 |
| 5,593,728 | * | 1/1997 | Moore et al. ..................... 427/255.2 |
| 5,605,871 | * | 2/1997 | Baldus et al. ..................... 501/96.4 |
| 5,952,100 | * | 9/1999 | Corman et al. ................... 428/384 |
| 5,972,511 | * | 10/1999 | Moore ............................... 428/408 |

FOREIGN PATENT DOCUMENTS

| 196 35 848 | 9/1996 | (DE) . |
|---|---|---|
| 355 366 | 2/1990 | (EP) . |
| 792274 | 3/1958 | (GB) . |

OTHER PUBLICATIONS

Derwent WPAT English Abstract for DE 196 35 848 (See Ref. E).
Derwent WPAT English Abstract for EP 355 366 (See Refs. A and F).

* cited by examiner

Primary Examiner—Shrive Beck
Assistant Examiner—Bret Chen
(74) Attorney, Agent, or Firm—Connolly Bove Lodge & Hutz LLP

(57) ABSTRACT

A process for coating substrates with a silicon-containing protective layer by chemical vapor deposition with a silicon-containing compound of the structural formula (1):

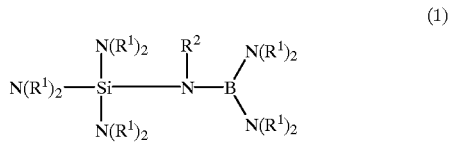

(1)

in which
$R^1$ is an alkyl group having 1 to 4 carbon atoms, and
$R^2$ is hydrogen or an alkyl group having 1 to 4 carbon atoms.

18 Claims, No Drawings

PROCESS FOR COATING SUBSTRATES WITH A SILICIUM-CONTAINING LAYER

BACKGROUND OF THE INVENTION

1. Field of the Invention

The invention relates to a process for the coating of substrates with a silicon-containing protective layer by chemical vapour deposition (CVD) coating.

2. Description of the Prior Art

In order to protect high-temperature components of carbon from oxidation it is known to provide the component with a quartz glass ($SiO_2$) layer by CVD using silanes. The amorphous quartz glass layer passes into the crystalline state (cristobalite) at a temperature above approximately 1,100° C. This so-called transition of quartz leads to cracks in the coating which lead to rapid oxidation of the carbon component, in particular following cooling and re-heating of the component, that is to say under conditions of thermal shock stress.

Although cracking can be checked by applying further layers, for example of silicon carbide, such a sequence of different layers is associated with a corresponding number of process steps and is hence costly and time-consuming. Moreover, a quartz glass layer applied to a metal substrate by CVD leads to spalling under conditions of mechanical and thermal shock stress.

The object of the invention is to provide substrates of different types in simple manner with a firmly adhering protective layer which also withstands high thermal shock stresses.

This is achieved according to the invention as decribed below.

SUMMARY OF THE INVENTION

In accordance with the invention, a compound of the following structure (1):

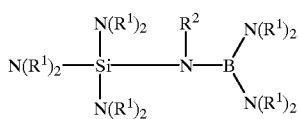

(1)

in which

R$^1$ is an alkyl group having 1 to 4 carbon atoms, and

R$^2$ is hydrogen or an alkyl group having 1 to 4 carbon atoms is used as the starting compound for the CVD process for the coating of the substrate.

DESCRIPTION OF THE PREFERRED EMBODIMENTS

R$^1$ is preferably a methyl radical and R$^2$ hydrogen. That is to say, tri(dimethylaminosilyl)-amino-di(dimethylamino) borane which has the following structural formula (2):

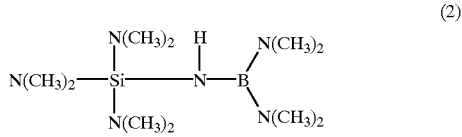

(2)

is preferably used.

A thermal CVD process, in particular an LPCVD (low-pressure CVD) process, is preferably employed as the CVD process. However, other CVD processes, in particular plasma CVD, may also be used according to the invention in place of the thermal CVD process.

The apparatus for the thermal CVD process preferably has a pressure-tight supply vessel which contains the liquid starting compound according to the formula (1) or (2) and is under pressure from an inert gas, for example argon. The liquid starting compound is supplied by way of a flow measuring device to a mixing means into which an inert gas, for example nitrogen, flows at the same time by way of a corresponding gas flow measuring device, as a result of which there is formed from the liquid starting compound in the mixing means an aerosol which is vaporised without residue in a heated vaporiser. The vapour is supplied to one end of a coating oven of preferably tubular construction, into which the substrate to be coated or a plurality of substrates are arranged above one another and/or in sequential manner. A vacuum pump is connected to the other end of the tubular oven.

When tri(dimethylaminosilyl)-amino-di(dimethylamino) borane is used as the starting compound, the vaporiser temperature is, for example, from 40° C. to 150° C., preferably 75° C. to 100° C. The negative pressure in the coating oven can be from $10^{-1}$ to $10^{-5}$; it is normally around $10^{-2}$ to $10^{-3}$ bar.

The deposition conditions can be maintained in precise manner using the CVD apparatus which is described, thus enabling layers having highly reproducible properties to be obtained.

In the coating oven the substrate is heated to a temperature of from 400° C. to 1800° C., in particular 650° C. to 1400° C. This enables a layer to be produced which remains amorphous at up to 1900° C.

The layer produced by the process according to the invention contains the following elements (wherein this term also includes the elements bonded together): silicon, nitrogen, boron and carbon. The elements Si, N and B may be present, as in the starting compound, in a molar ratio of 1:1:1. The layer may also contain, in addition to the elements Si, N, B and C, organic residues formed from the starting compound which influence the properties of the layer. If these organic residues are to be removed from the layer, the substrate is heated to a correspondingly high temperature. The CVD deposition in the oven may, however, also take place with the substrate at a temperature which is rather lower, and a thermal post-treatment be carried out at from 600° C. to 1800° C. in an oven, in order to expel the organic residues.

The Si—N—B—C layer thus formed is in particular suitable for protecting metal parts. The metal parts may be of, for example, steel or a titanium alloy.

The protective layer applied to the metal part by the process according to the invention is distinguished by high adhesion. This is in particular extremely successful if the metal part is coated in the unpolished state, for instance has a peak-to-valley height of more than 5 #m.

The layer which is applied to the metal part by the process according to the invention has high wear resistance and lubricating properties in addition to the high adhesion. The former properties can be influenced by the content of organic residues deriving from the alkyl groups of the starting substrate.

Owing to the excellent tribological properties of the ceramic protective layer created according to the invention, the process according to the invention may be used, for example, for coating metal parts in automotive construction.

In addition to the coating of metal substrates, the process according to the invention is above all also eminently suitable for the coating of carbon substrates or of composite substrates prepared from carbon and silicon, which are exposed to high temperature, in particular to high thermal shock stress, for example in space travel, for example for jet engine nozzles. It is furthermore suitable for the coating of ceramic substrates.

If the carbon, silicised carbon or ceramic components coated with the Si—N—B—C protective coating by the process according to the invention are heated to temperatures of, for example, from 900° C. to 1800° C., in particular 1200° C. to 1600° C., in an oxygen-containing atmosphere such as, for example, air, the Si at the surface of the protective coating oxidises to $SiO_x$, that is to say SiO and $SiO_2$.

The latter oxidation may take place as a result of post-treating the coated substrate in an oven, or during use of the component at high temperatures in the atmosphere.

The $SiO_x$ which is formed at the surface of the component has a relatively low melting point owing to the boron. Consequently, the protective layer in the surface region melts even when the temperature is relatively low, and the melt seals any cracks which may arise in the underlying region of the protective layer, as a result of which oxygen penetration to the substrate of carbon or of carbon/silicon is prevented. That is to say, the $SiO_x$ content in the surface of the protective layer is effective at high temperatures, while the Si—N—B—C phase of the remaining protective layer, that is to say the base layer, protects the component from oxidation at low temperatures. The same is true of the nitrogen-containing substrates.

As a result of the process according to the invention, a protective layer is created which protects the coated component from oxidation at up to approximately 1900° C. in reliable manner even under conditions of thermal shock stress in accordance with the processes hitherto.

The Examples which follow serve to explain the process according to the invention, while not limiting it.

EMBODIMENT EXAMPLES

Example 1

Two substrates of reaction-bonded $Si_3N_4$ were heated to 900° C. in the coating oven. 2 ml of the starting compound tri(dimethylaminosilyl)-amino-di(dimethylamino) borane were vaporised at 90° C. and guided through the coating oven. The pressure in the oven was $5\times10^{-5}$ bar. After 90 minutes the starting compound was exhausted, and the substrates were cooled to room temperature. One of the two substrates was coated again under identical conditions. The substrates were then aged in nitrogen at 1450° C. for 1 hour. The coatings covered the substrates evenly. Scanning electron (SEM) and transmission electron (TEM) micrographs showed the intimate bond between the substrate and the first coating, and between the first and second coatings. Both applied layers were amorphous. Electron-dispersive X-ray (EDX) analyses showed the layer to contain Si, N, B and C. The total layer thickness, measured on the twice-coated sample, was 7 to 8 μm.

Example 2

Substrates of reaction-bonded $Si_3N_4$ were heated to 950° C. in the coating oven. 4 ml of the starting compound tri(dimethylaminosilyl)-amino-di(dimethylamino) borane were vaporised at 80° C. and guided into the coating oven. The pressure in the oven was $2\times10^{-5}$ bar. After the starting compound had vaporised the substrates were cooled to room temperature. The substrates were coated a second time under identical conditions. The substrates were then aged in nitrogen at 1450° C. for 2 hours. The coatings covered the substrates evenly.

Example 3

A substrate of graphite was heated to 1000° C. in the coating oven. 1 ml of the starting compound tri(dimethylaminosilyl)-amino-di(dimethylamino) borane was vaporised at 100° C. and guided through the coating oven. The pressure in the oven was $2.7\times10^{-3}$ bar. After the starting compound had vaporised the substrate was cooled to room temperature. The substrate was then aged in nitrogen at 1450° C. for one hour. The coating covered the substrate evenly. Scanning electron microscopic (SEM) examination showed an intimate bond between the substrate and the coating. Measurements taken using X-ray micro-analysis showed Si, N, B and C in the layer. The layer thickness was 2.6 μm.

What is claimed is:

1. A process for coating a substrate with a silicon-containing protective layer, by chemical vapor deposition using a starting compound of the structural formula (1):

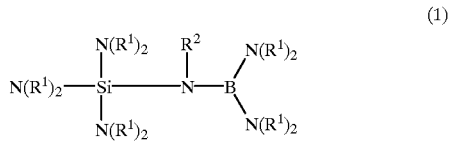

(1)

in which

R[1] is an alkyl group having 1 to 4 carbon atoms, and

R[2] is hydrogen or an alkyl group having 1 to 4 carbon atoms.

2. The process according to claim 1, wherein the starting compound is tri(dimethylaminosily)-amino-di(dimethylamino)borane.

3. The process according to claim 1, wherein the chemical vapour deposition is carried out with thermal or plasma means.

4. The process according to claim 1, wherein the pressure is from $10^{-1}$ to $10^{-5}$ bar.

5. The process according to claim 1, wherein the substrate is coated at a temperature of from 400° C. to 1800° C.

6. The process according to claim 1, further comprising the step of thermally post-treating the coated substrate at a temperature of from 600° C. to 1800° C.

7. The process according to claim 6, wherein the thermal post-treatment step is carried out in an oxygen-containing atmosphere.

8. The process according to claim 1, wherein the substrate contains a metal or at least one element selected from the group consisting of carbon, silicon and nitrogen.

9. The process according to claim 8, wherein the substrate is a metal substrate.

10. The process according to claim 9, wherein the metal substrate is unpolished.

11. The process according to claim 1, which is carried out in a tubular coating oven.

12. The silicon-containing article of manufacture comprising a substrate having adhered thereto a silicon-containing protective layer

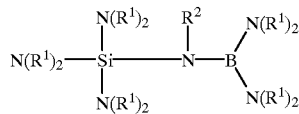
(1)

prepered from the process according to claim 1.

13. The silicon-containing article of manufacture according to claim 12, wherein the substrate contains a metal or at least one element selected from the group consisting of carbon, silicon and nitrogen.

14. The silicon-containing article of manufacture according to claim 12, wherein the substrate is coated at a temperature of from 400° C. to 1800° C.

15. The silicon-containing article of manufacture according to claim 12, wherein the coated substrate is thermally post-treated at a temperaature of from 600° C. to 1800° C.

16. The silicon-containing article of manufacture according to claim 12, wherein the substrate is coated by chemical vapor deposition which is carried out with thermal or plasma means.

17. The silicon-containing article of manufacture according to claim 12, wherein the substrate is coated at a pressure from $10^{-1}$ to $10^{-5}$ bar.

18. The silicon-containing article of manufacture according to claim 12, wherein the starting compound is tri (dimethylaminosilyl)-amino-di(dimethylamino) borane.

* * * * *